(12) United States Patent
Kim et al.

(10) Patent No.: US 8,940,557 B2
(45) Date of Patent: Jan. 27, 2015

(54) METHOD OF FABRICATING WAFER LEVEL PACKAGE

(71) Applicant: Samsung Electronics Co., Ltd., Suwon-si, Gyeonggi-do (KR)

(72) Inventors: Sang-won Kim, Asan-si (KR); Jong-youn Kim, Seoul (KR); Eun-kyoung Choi, Hwaseong-si (KR); Sang-uk Han, Hwaseong-si (KR); Ji-seok Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 27 days.

(21) Appl. No.: 13/921,415

(22) Filed: Jun. 19, 2013

(65) Prior Publication Data

US 2013/0344627 A1  Dec. 26, 2013

(30) Foreign Application Priority Data

Jun. 20, 2012 (KR) .................. 10-2012-0066318

(51) Int. Cl.
*H01L 21/66* (2006.01)
*H01L 21/56* (2006.01)
(Continued)

(52) U.S. Cl.
CPC .............. *H01L 21/565* (2013.01); *H01L 22/10* (2013.01); *H01L 21/561* (2013.01); *H01L 25/0652* (2013.01); *H01L 24/94* (2013.01); *H01L 24/97* (2013.01); *H01L 25/0657* (2013.01); *H01L 25/50* (2013.01); *H01L 24/05* (2013.01); *H01L 24/06* (2013.01); *H01L 24/13* (2013.01); *H01L 24/16* (2013.01); *H01L 24/29* (2013.01); *H01L 24/32* (2013.01); *H01L 24/73* (2013.01); *H01L 24/92* (2013.01); *H01L 2224/0401* (2013.01); *H01L 2224/05009* (2013.01); *H01L 2224/05624* (2013.01); *H01L 2224/05639* (2013.01); *H01L 2224/05644* (2013.01); *H01L 2224/05647* (2013.01); *H01L 2224/05664* (2013.01); *H01L 2224/06181* (2013.01); *H01L 2224/13025* (2013.01); *H01L 2224/16145* (2013.01); *H01L 2224/16225* (2013.01); *H01L 2224/2919* (2013.01); *H01L 2224/32145* (2013.01); *H01L 2224/32225* (2013.01);
(Continued)

(58) Field of Classification Search
None
See application file for complete search history.

(56) References Cited

U.S. PATENT DOCUMENTS 7,371,618 B2  5/2008  Yoon
7,947,530 B2  5/2011  Kim et al.
(Continued)

FOREIGN PATENT DOCUMENTS

KR  10-2006-0093690  8/2006
KR  10-2008-0013770  2/2008
(Continued)

*Primary Examiner* — Kyoung Lee
(74) *Attorney, Agent, or Firm* — Ellsworth IP Group PLLC

(57) ABSTRACT

A method of fabricating a wafer level package includes preparing a wafer including a plurality of first semiconductor chips, mounting a plurality of second semiconductor chips on the wafer, disposing the wafer on a lower mold and disposing an upper mold so as to surround edges of a top surface of the wafer, dispensing a molding member on the wafer, and pressurizing the molding member by using a plunger so as to fabricate a wafer level package in which a top surface of each of the plurality of second semiconductor chips is exposed.

17 Claims, 6 Drawing Sheets

(51) Int. Cl.
*H01L 25/065* (2006.01)
*H01L 23/00* (2006.01)
*H01L 25/00* (2006.01)

(52) U.S. Cl.
CPC ............... *H01L 2224/73204* (2013.01); *H01L 2224/92125* (2013.01); *H01L 2224/94* (2013.01); *H01L 2224/97* (2013.01); *H01L 2225/06517* (2013.01); *H01L 2924/10253* (2013.01); *H01L 2924/10271* (2013.01); *H01L 2924/10329* (2013.01); *H01L 2924/1431* (2013.01); *H01L 2924/1434* (2013.01); *H01L 2924/1435* (2013.01); *H01L 2924/1438* (2013.01); *H01L 2924/1441* (2013.01); *H01L 2924/18161* (2013.01); *H01L 2924/3511* (2013.01); *H01L 2225/06513* (2013.01); *H01L 2225/06541* (2013.01); *H01L 2225/06565* (2013.01); *H01L 2225/06568* (2013.01); *H01L 22/12* (2013.01); *H01L 22/20* (2013.01)
USPC ............. 438/15; 438/106; 438/109; 438/110; 438/113; 438/126; 257/690; 257/713; 257/723; 257/738; 257/778

(56) References Cited

U.S. PATENT DOCUMENTS

| | | |
|---|---|---|
| 2007/0052094 A1 | 3/2007 | Kim et al. |
| 2008/0217752 A1 | 9/2008 | Hata et al. |
| 2008/0265462 A1 | 10/2008 | Yang et al. |
| 2009/0039142 A1 | 2/2009 | Bezama et al. |
| 2010/0308474 A1* | 12/2010 | Shibuya et al. ............... 257/778 |
| 2011/0260336 A1 | 10/2011 | Kang et al. |
| 2011/0291138 A1 | 12/2011 | Hsieh et al. |
| 2012/0025362 A1 | 2/2012 | Chandrasekaran et al. |

FOREIGN PATENT DOCUMENTS

| | | |
|---|---|---|
| KR | 10-2009-0066517 | 6/2009 |
| KR | 10-2011-0068314 | 6/2011 |

\* cited by examiner

METHOD OF FABRICATING WAFER LEVEL PACKAGE

CROSS-REFERENCE TO RELATED APPLICATIONS

This application claims the benefit of priority under 35 U.S.C. §119 from Korean Patent Application No. 10-2012-0066318, filed on Jun. 20, 2012, in the Korean Intellectual Property Office, the disclosure of which is incorporated herein in its entirety by reference.

BACKGROUND

1. Field

The inventive concept relates to a method of fabricating a wafer level package, and more particularly, to a method of fabricating a wafer level package whereby a top surface of each of a plurality of semiconductor chips is exposed.

2. Description of the Related Art

Electronic products require high-capacity data processing even when their volume decreases gradually. Thus, the need of increasing integration of a semiconductor device that is used in these electronic products increases. In particular, a package for a semiconductor integrated circuit (IC) has been developed into a wafer level package that maintains characteristics of a bare chip and reduces the size of the wafer level package to that of the semiconductor chip. However, a process of grinding a molding member is required when the wafer level package is fabricated. Thus, a semiconductor manufacturing process becomes complicated, and it is very difficult to select a material for the molding member.

SUMMARY

The inventive concept provides a method of fabricating a wafer level package, whereby a molding member and a top surface of each of a plurality of semiconductor chips are at the same level.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of fabricating a wafer level pacakge, the method including preparing a wafer including a plurality of first semiconductor chips, mounting a plurality of second semiconductor chips on the wafer, disposing the wafer on a lower mold and disposing an upper mold so as to surround edges of a top surface of the wafer, dispensing a molding member on the wafer, and pressurizing the molding member by using a plunger so as to fabricate a wafer level package in which a top surface of each of the plurality of second semiconductor chips is exposed.

The mounting of the plurality of second semiconductor chips may include mounting the plurality of second semiconductor chips on the wafer by using flip chip bonding.

The method may further include, between the mounting of the plurality of second semiconductor chips and the disposing of the upper mold, forming an underfill member between each of the second semiconductor chips and the wafer.

The second semiconductor chips may each have a structure in which a plurality of semiconductor chips are stacked, the plurality of semiconductor chips being connected to each other via a through silicon via (TSV), and the second semiconductor chips are electrically connected to the first semiconductor chips.

The method may further include, between the dispensing of the molding member on the wafer and the fabricating of the wafer level package, attaching a release film to a bottom surface of the plunger.

A thickness of the release film may be about 50 μm to about 200 μm.

The fabricating the wafer level package may include disposing the molding member on a top surface of the wafer between the second semiconductor chips.

A top surface of the molding member may have a step height of about ±25 μm based on a top surface of each second semiconductor chip.

The dispensing of the molding member on the wafer may include calculating a first volume by multiplying a width of the wafer excluding a region that contacts the upper mold and a height of the top surface of each second semiconductor chip from the top surface of the wafer, calculating a second volume by multiplying the height and a sum of the widths of the plurality of second semiconductor chips, and calculating a volume of the molding member to be dispensed on the wafer by subtracting the second volume from the first volume and predicting a weight of the molding member by multiplying the volume of the molding member and a density of the molding.

A width of the first semiconductor chip may be equal to or greater than a width of the second semiconductor chip, and a size of the first semiconductor chip may be equal to or greater than a size of the second semiconductor chip based on the same direction.

The dispensing of the molding member on the wafer may include dispensing the molding member in a plurality of points of the wafer.

The foregoing and/or other features and utilities of the present general inventive concept may also be achieved by providing a method of fabricating a wafer level package, the method including mounting a plurality of second semiconductor chips on a wafer, disposing the wafer on a lower mold and disposing an upper mold so as to surround edges of a top surface of the wafer such that a molding process is performed, dispensing a molding member on the wafer, and performing a compression process using a plunger on the dispensed molding member so as to fabricate a wafer level package in which a top surface of each of the plurality of second semiconductor chips is exposed.

The wafer may include a plurality of first semiconductor chips, and the second semiconductor chips are electrically connected to the plurality of first semiconductor chips by using a bump.

The fabricating of the wafer level package may include disposing the molding member on the top surface of the wafer between the second semiconductor chips, and a top surface of the molding member has a step height of about ±25 μm based on the top surface of each second semiconductor chip.

The second semiconductor chips each may have a structure in which a plurality of semiconductor chips are stacked, the plurality of semiconductor chips being connected to each other via a through silicon via (TSV), and in the fabricating of the wafer level package, a top surface of each second semiconductor chip is exposed.

The foregoing and/or other features and utilities of the present general inventive concept may also be achieved by providing a method of fabricating a wafer level package such that a top surface of a plurality of semiconductor chips of the wafer level package is exposed without performing a grinding process, the method comprising calculating a predetermined amount of a molding member according to the volume of space between the plurality of semiconductor chips, disposing the predetermined amount of molding member within in a mold on a top surface of the wafer level package, and shaping the molding member such that the top surface of the plurality of semiconductor chips is exposed.

The foregoing and/or other features and utilities of the present general inventive concept may also be achieved by providing a method of fabricating a semiconductor memory, comprising preparing a plurality of first semiconductor chips in a wafer, mounting a plurality of second semiconductor chips on a top surface of the wafer such that the second semiconductor chips are electrically connected to the first semiconductor chips, disposing a predetermined amount of molding member within in a mold on a top surface of the wafer, and pressurizing the molding member such that the top surface of the second semiconductor chips is exposed.

The foregoing and/or other features and utilities of the present general inventive concept may also be achieved by providing a non-transitory computer-readable medium to contain computer-readable codes as a program to execute the method of fabricating a wafer level package as described above.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
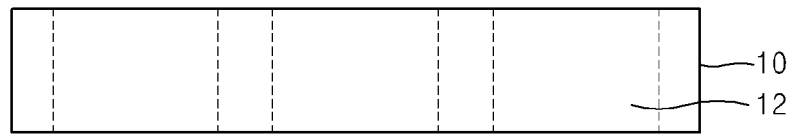
FIGS. 1 through 3 and FIGS. 5 through 7 illustrate cross-sectional views to describe a method of fabricating a wafer level package according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

The exemplary embodiments may be embodied in many different forms and should not be construed as being limited to those set forth herein; rather, these embodiments are provided so that this disclosure will be thorough and complete, and will fully convey the inventive concept to those skilled in the art. Furthermore, various elements and regions in the drawings are schematically illustrated. Thus, the inventive concept is not limited by a relative size or distance in the attached drawings.

The terms used herein are used to describe embodiments of the inventive concept, and not to limit the inventive concept. A singular form may include a plural form, unless otherwise defined. The term "comprise" and/or "comprising" specify the existence of mentioned shapes, numbers, steps, operations, elements, parts, and/or groups thereof, and do not exclude existence or addition of at least one of other shapes, numbers, steps, operations, elements, parts, and/or groups thereof. As used herein, the term "and/or" includes any one of at least one of combinations of one or more of the associated listed items.

In the present description, terms, such as first, second, and the like, are used to describe various members, components, regions, layers, and/or portions. However, it is obvious to one of ordinary skill in the art that the elements, components, areas, layers, and/or parts are not limited by these terms. The terms are used only for distinguishing one member, component, region, layer, or portion from another member, component, region, layer, or portion. Thus, a first member, region, layer, or portion which will be described may also refer to a second member, component, region, layer, or portion, without the teaching of the inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
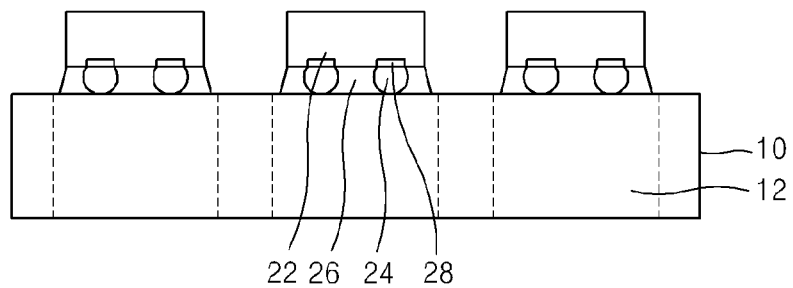
Figure 3:
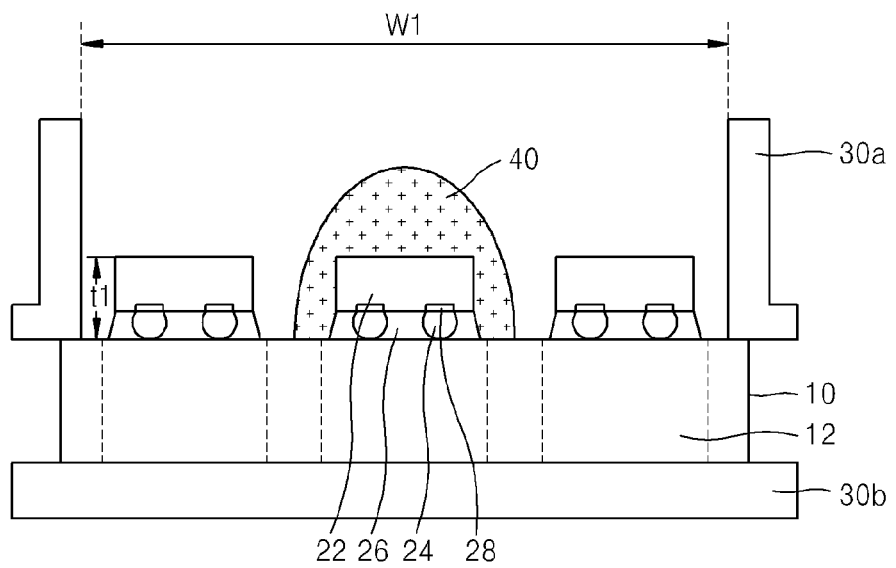
Figure 4:
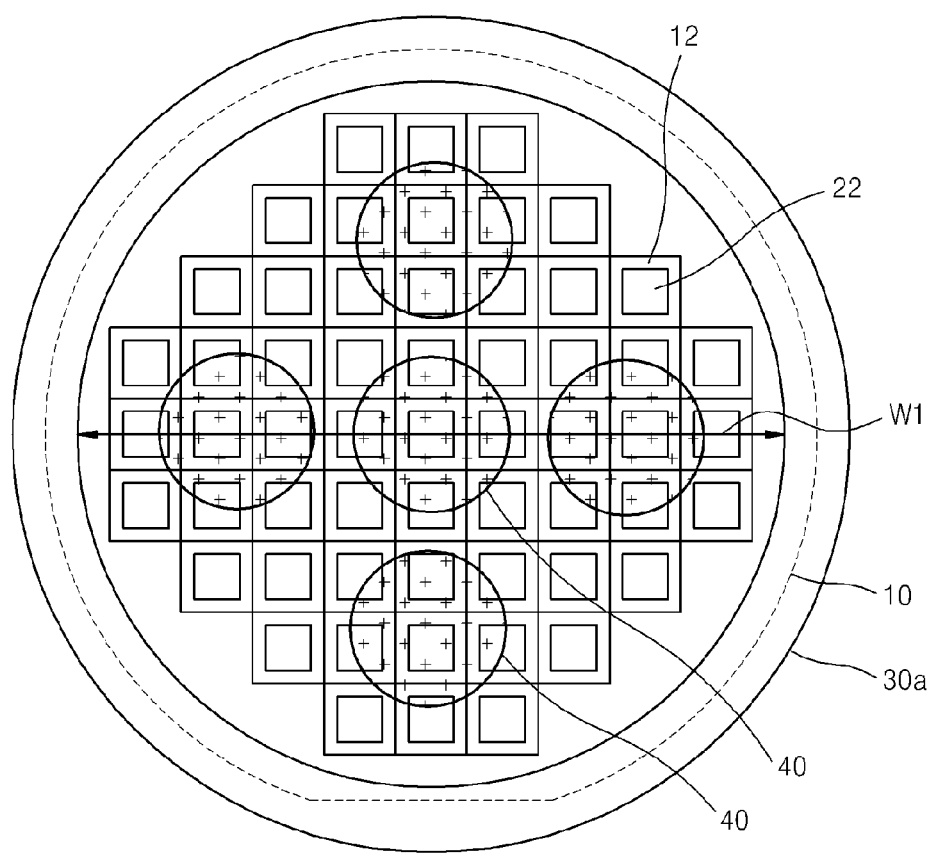
FIG. 4 illustrates a plan view of FIG. 3 to describe the method of fabricating the wafer level package illustrated in FIGS. 1 through 3 and FIGS. 5 through 7.

FIGS. 1 through 3 and FIGS. 5 through 7 are cross-sectional views for describing a method of fabricating a wafer level package 1 according to an exemplary embodiment of the present general inventive concept, and FIG. 4 is a plan view of FIG. 3 for describing the method of fabricating the wafer level package 1 illustrated in FIGS. 1 through 3 and FIGS. 5 through 7.

Referring to FIG. 1, a wafer 10 including a plurality of first semiconductor chips 12 is prepared.

The plurality of first semiconductor chips 12 may include an integrated circuit (IC) formed therein (not illustrated). For example, the IC may include a memory circuit or logic circuit.

The wafer 10 may include silicon, silicon on insulator (SOI), gallium arsenic, silicon germanium, ceramic, or quartz. However, the present general inventive concept is not limited thereto.

Referring to FIG. 2, a plurality of second semiconductor chips 22 are mounted on the wafer 10. The plurality of second semiconductor chips 22 may be electrically connected to the first semiconductor chips 12 via a bump 24.

The second semiconductor chips 22 may be mounted on the wafer 10 by using flip chip bonding so that an active surface of each second semiconductor chip 22 faces a top surface of the wafer 10. However, the present general inventive concept is not limited thereto.

Also, the top surface of the wafer 10 may be an active or non-active surface of each first semiconductor chip 12. For example, when the top surface of the wafer 10 is the inactive surface of the first semiconductor chip 12, the first semiconductor chip 12 including a through silicon via (TSV) therein may be electrically connected to the second semiconductor chip 22 via a bump 24.

The second semiconductor chip 22 may include an integrated circuit (IC) formed therein (not illustrated). For example, the IC may include a memory circuit or logic circuit. At least one pad 28 that is connected to an internal IC may be disposed on the active surface of the second semiconductor chip 22. The pad 28 may be formed of metal, for example, such as aluminum (Al), copper (Cu), silver (Ag), gold (Au), or palladium (Pd). However, aspects of the present general inventive concept are not limited thereto.

The first and second semiconductor chips 12 and 22 may be the same type of or a different type of product. For example, some of the first and second semiconductor chips 12 and 22 may be memory chips, and the remaining portions thereof may be non-memory chips. Optionally, the first and second semiconductor chips 12 and 22 may be all memory chips. The first and second semiconductor chips 12 and 22 may include, for example, a flash memory, phase change random access memory (PRAM), resistive RAM (RRAM), ferroelectric RAM (FeRAM), and/or magnetic RAM (MRAM).

The first and second semiconductor chips 12 and 22 may have the same size or different sizes according to the type of the memory circuit.

For example, the width of the first semiconductor chip 12 may be equal to or greater than that of the second semiconductor chip 22, and the size of the first semiconductor chip 12 may be equal to or greater than that of the second semiconductor chip 22 based on the same direction.

Also, an underfill member 26 may be further disposed between the wafer 10 and the second semiconductor chip 22. The underfill member 26 may serve to supplement lowering of bonding reliability caused by a difference in thermal expansion coefficients between the wafer 10 and the second semiconductor chip 22, and to protect the bump 24 from an external environment. The underfill member 26 may be, for example, an insulating material, such as an epoxy resin.

Referring to FIGS. 3 and 4, in order to perform a molding process, a lower mold 30b is disposed on a bottom surface of the wafer 10 so as to support the wafer 10, and an upper mold 30a is disposed so as to surround edges of the top surface of the wafer 10.

A molding member 40 is dispensed on the wafer 10. The molding member 40 may be dispensed in at least one point of the wafer 10.

The weight of the molding member 40 is selected in such a way that a wafer level package (see 1 of FIG. 5) on which the top surface of the second semiconductor chip 22 is exposed, may be formed. That is, the weight of the molding member 40 at which the top surface of the second semiconductor chip 22 of the wafer level package (see 1 of FIG. 5) may be exposed without performing a grinding process, is selected before the molding process is performed. The weight of the molding member 40 may be selected using the following Equation 1:

Weight of the molding member 40=((t1*W1)−
(t1*Σwidths of the second semiconductor chips
22))*density of the molding member 40 where t1 is a height from the top surface of the wafer 10 to the top surface of the second semiconductor chip 22 and W1 is a width of the wafer 10 excluding a region that contacts the upper mold 30a.

Since the molding process is performed using the calculated weight of the molding member 40, the top surface of the second semiconductor chip 22 is exposed. Thus, a grinding process of removing the molding member 40 from the second semiconductor chip 22 may be omitted. Thus, time and cost of a process of fabricating the wafer level package (see 1 of FIG. 5) may be reduced. Also, due to the grinding process, selection of the molding member 40 is normally limited; however, since the grinding process is omitted in the present general inventive concept, a molding member 40 that may increase the reliability of the wafer level package (see 1 of FIG. 5) may be freely selected. Also, since the molding member 40 having a predetermined weight is used, a region in which a stress occurs due to the difference in thermal expansion coefficients between the molding member 40 and the wafer 10, may be minimized. As a result, warpage of the wafer 10 may be minimized.

Figure 5:
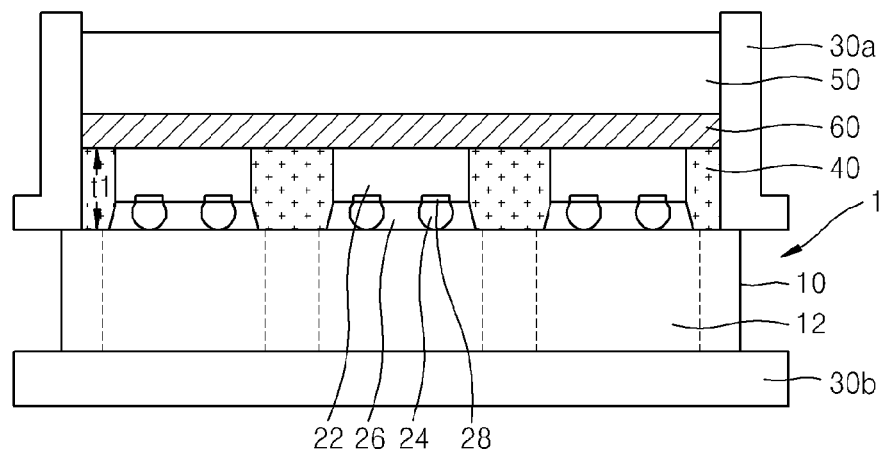

Molding member 40 may be permitted to settle into or be forced to fill the spaces between the second semiconductor chips 22. Referring to FIG. 5, for example, the molding member 40 is pressurized using a plunger 50 in a state where a release film 60 is attached to a bottom surface of the plunger 50.

The molding member 40 is pressurized by the plunger 50 and is disposed on the top surface of the wafer 10 between the second semiconductor chips 22.

Thus, a wafer level package 1 may be fabricated having a wafer 10 including a first semiconductor chip 12, a second semiconductor chip 22 mounted on the wafer 10, and the wafer 10 and the second semiconductor chip 22 supported by a molding member 40 having a minimum weight.

Also, since the predetermined weight of the molding member 40 has been selected as described above, the wafer level package 1 may be fabricated having the top surface of the second semiconductor chip 22 exposed.

The release film 60 is disposed between the second semiconductor chip 22 and the plunger 50. The wafer level package 1 may be easily removed from the plunger 50 by using the release film 60, and the second semiconductor chip 22 may be protected from the molding process. The thickness of the release film 60 may be 50 μm to 200 μm.

Also, the second semiconductor chip 22 is mounted on the wafer 10 including the first semiconductor chip 12, as described above. However, the present general inventive concept is not limited thereto. It is possible that after the second semiconductor chip 22 is disposed on a carrier, the wafer level package 1 may be fabricated using the same method.

In addition, even when the wafer level package 1 is fabricated using the molding member 40 having the predetermined weight calculated, the molding member 40 may have a step height of about ±25 μm based on the height t1 of the top surface of the second semiconductor chip 22 for the reason of a process margin.

Figure 6:
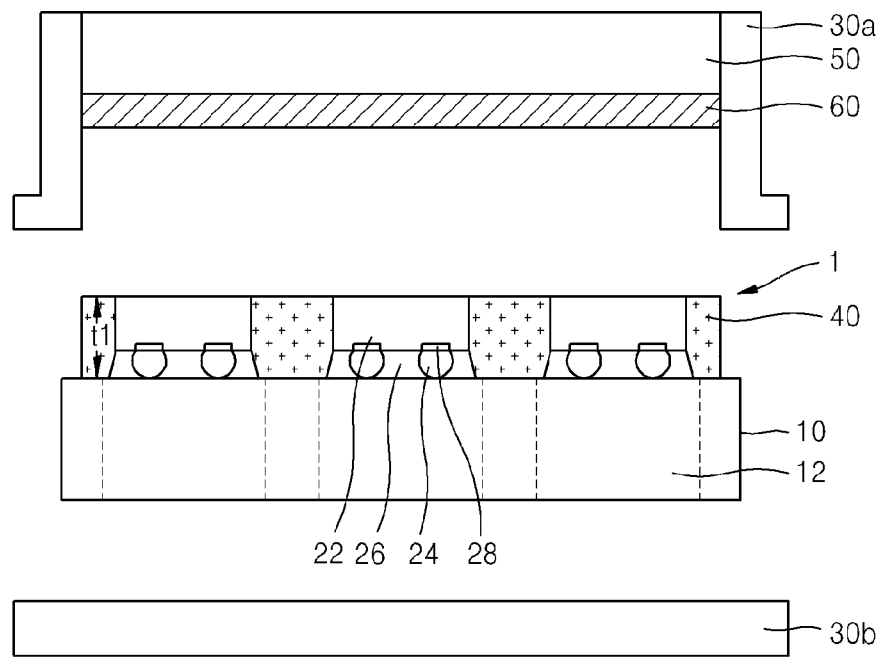

Referring to FIG. 6, the wafer level package 1 is removed from the upper and lower molds 30a and 30b.

Figure 7:
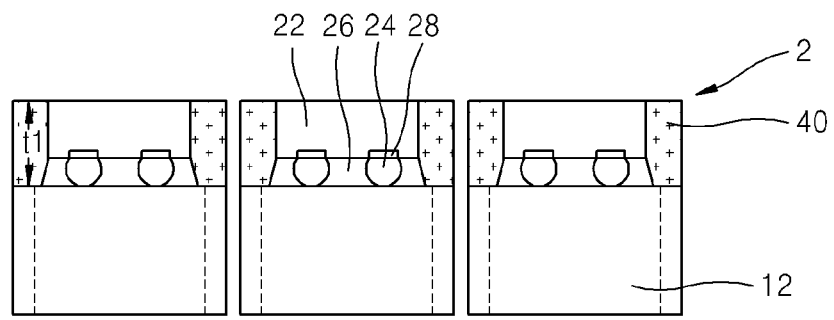

Next, as illustrated in FIG. 7, a dicing process is performed on the wafer level package 1 so that each unit wafer level package 2 may be fabricated.

Figure 8:
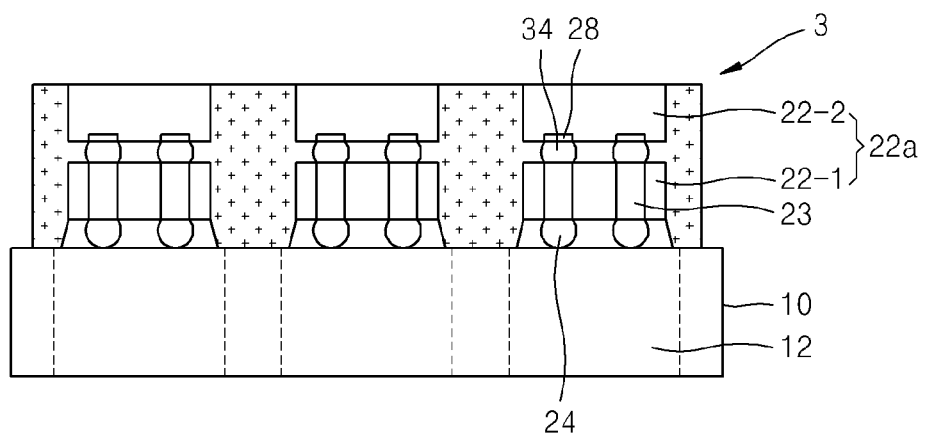
FIG. 8 illustrates a cross-sectional view of a wafer level package fabricated according to an exemplary embodiment of the present general inventive concept.

FIG. 8 is a cross-sectional view schematically illustrating a wafer level package 3 fabricated according to an embodiment of the inventive concept.

Like reference numerals of FIG. 8 that are the same as those of FIGS. 1 through 7 refer to like elements, and redundant descriptions thereof will be omitted for clarity of description.

A second semiconductor chip 22a of the wafer level package 3 of FIG. 8 may have a structure in which a plurality of semiconductor chips 22-1 and 22-2 are stacked, unlike the second semiconductor chip 22 of the wafer level package 1 of FIG. 6.

For example, the second semiconductor chip 22a includes the plurality of semiconductor chips 22-1 and 22-2 that are stacked in a vertical direction, and the semiconductor chips 22-1 and 22-2 are electrically connected to each other via a through silicon via (TSV) 23 and a bump 34. Also, the second semiconductor chip 22a may be electrically connected to the first semiconductor chip 12 via a bump 24.

By using the method described with reference to FIGS. 1 through 6, the wafer level package 3 may be fabricated having a top surface of the second semiconductor chip 22a exposed from the molding member 40.

Also, the second semiconductor chip 22a has a structure in which two semiconductor chips 22-1 and 22-2 are stacked, as described above. However, aspects of the inventive concept are not limited thereto, and the second semiconductor chip 22a may have a structure in which three or more semiconductor chips are stacked.

Figure 9:
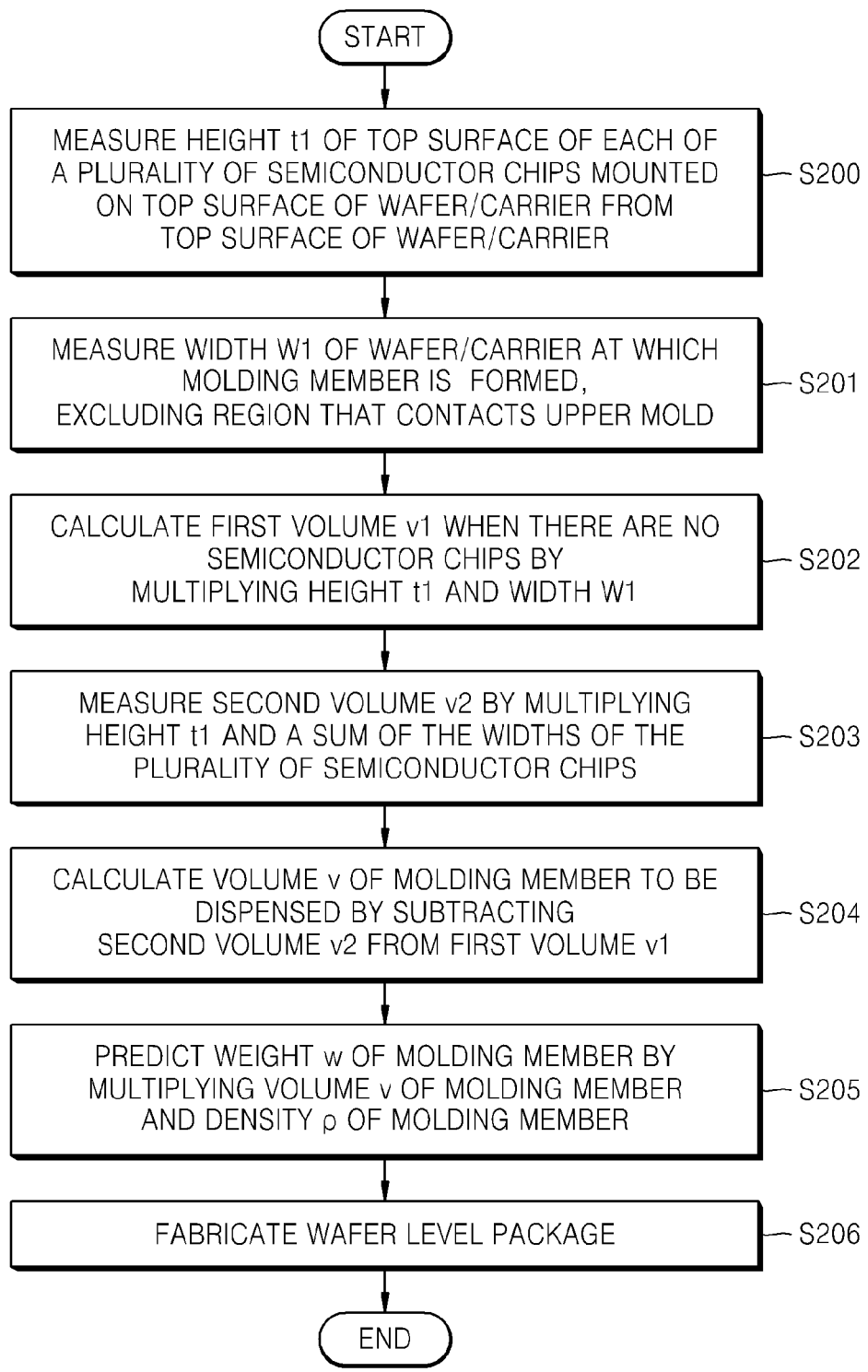
FIG. 9 illustrates a flowchart of a method of fabricating a wafer level package according to another exemplary embodiment of the present general inventive concept.

FIG. 9 is a flowchart illustrating a method of fabricating a wafer level package according to another embodiment of the inventive concept.

Referring to FIG. 9, a height t1 of a top surface of each of a plurality of semiconductor chips that are mounted on a top surface of a wafer or carrier, is measured from the top surface of the wafer or carrier at operation S200.

At operation S201 a width W1 of the wafer or carrier at which a molding member is formed, excluding a region that contacts an upper mold, is measured. The order of measuring the height t1 and the width W1 is not limited hereto and may be reversed.

A first volume v1 of the molding member and the semiconductor chip with respect to the wafer level package in which the top surface of each of the plurality of semiconductor chips is exposed is calculated by multiplying the height t1 and the width W1 at operation S202.

A second volume v2 is measured by multiplying the height t1 and a sum of the widths of the plurality of semiconductor chips at operation S203. When an underfill resin as an underfill member is deposited between the wafer or carrier and each semiconductor chip, a third volume v3 of the underfill member that deviates from a region of the semiconductor chips, is measured to be used in measuring the second volume v2 for more accurate calculation. However, since the third volume v3 of the underfill member is ignorably small compared to the second volume v2, measurement of the third volume v3 may be omitted.

A volume v of the molding member to be formed on the top surface of the wafer or carrier is calculated by subtracting the second volume v2 from the first volume v1 at operation S204.

A weight w of the molding member at which the top surface of each semiconductor chip may be exposed, is predicted by multiplying the volume v by a density p of the molding member at operation S205.

The weight w of the predicted molding member is dispensed on the wafer or carrier, and a compression process is performed on the molding member by using a plunger, thereby fabricating the wafer level package in which the top surface of each semiconductor chip is exposed at operation S206.

Since the wafer level package is fabricated using the method of fabricating the wafer level package illustrated in FIGS. 1 through 3 and FIGS. 5 through 7 or FIG. 9, the wafer level package in which the top surface of each semiconductor chip is exposed may be fabricated using a molding process. Also, since a grinding process of exposing the top surface of each semiconductor chip may be omitted, there may be a large choice in the molding member, and process time and process cost may be reduced.

Figure 10:
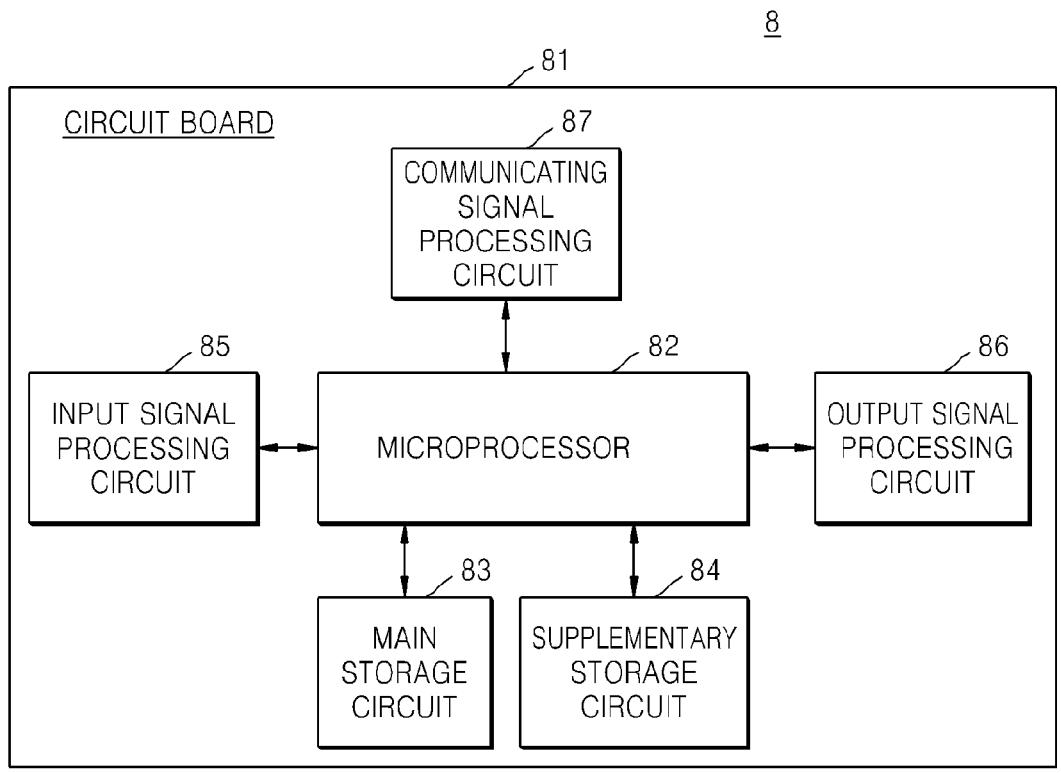
FIG. 10 illustrates a block diagram of an electronic circuit board including a wafer level package fabricated using the method of fabricating the wafer level package illustrated in FIGS. 1 through 3 and FIGS. 5 through 7 according to an exemplary embodiment of the present general inventive concept.

FIG. 10 is a block diagram schematically illustrating an electronic circuit board 8.

Referring to FIG. 10, the electronic circuit board 8 includes a microprocessor 82, a main storage circuit 83 and a supplementary storage circuit 84 that communicate with the microprocessor 82, an input signal processing circuit 85 that sends instructions to the microprocessor 82, an output signal processing circuit 86 that receives the instructions from the microprocessor 82, and a communicating signal processing circuit 87 that exchanges electrical signals with other circuit boards and/or external devices. Arrows indicated in FIG. 10 may be understood to mean paths on which the electrical signals may be transmitted.

The microprocessor 82 may receive and process various electrical signals, may output the result of processing the electrical signals and may control the elements of the electronic circuit board 8. The microprocessor 82 may be understood as a central processing unit (CPU), and/or a main control unit (MCU), for example. The main storage circuit 83 may temporarily store data that are always or frequently required by the microprocessor 82, or data before/after processing is performed. The main storage circuit 83 requires a fast response and thus may be configured of a semiconductor memory. More specifically, the main storage circuit 83 may be a semiconductor memory that is called a cache, static RAM (SRAM), dynamic RAM (DRAM), RRAM, their applied semiconductor memories, for example, utilized RAM, FeRAM, fast cycle RAM, MRAM, or another semiconductor memory. In addition, the main storage circuit 83 has no relation with volatile/nonvolatile characteristics and may include RAM.

Thus, the main storage circuit 83 may include the wafer level package fabricated using the method of fabricating the wafer level package illustrated in FIGS. 1 through 3 and FIGS. 5 through 7 or FIG. 9.

The supplementary storage circuit 84 as a large-capacity storage device may be nonvolatile semiconductor memory, such as flash memory or PRAM, a hard disc drive using a magnetic field, or a compact disc drive using light. The supplementary storage circuit 84 may be used to store large-capacity data instead of no need of high speed compared to the main storage circuit 83.

The supplementary storage circuit 84 has no relation with randomness/non-randomness and may include a nonvolatile storage device. The supplementary storage circuit 84 may include at least one semiconductor module. The input signal processing circuit 85 may convert external instructions into electrical signals or may transmit electrical signals transmitted from an external device to the microprocessor 82. The instructions or electrical signals transmitted from the external device may be operating instructions, electrical signals to be processed, or data to be stored. The input signal processing circuit 85 may be, for example, a terminal signal processing circuit that processes signals transmitted from a keyboard, a mouse, a touch pad, an image recognition device, or various sensors, an image signal processing circuit that processes image signal input of a scanner or camera, or several sensors or input signal interfaces.

The output signal processing circuit 86 may be an element for transmitting the electrical signals processed by the microprocessor 82 to the external device. For example, the output signal processing circuit 86 may be a graphic card, an image processor, an optical transducer, a beam panel card, or an interface circuit having various functions. The communicating signal processing circuit 87 is an element for exchanging the electrical signals directly with another electronic system or another circuit board without passing through the input signal processing circuit 85 or the output signal processing circuit 86. For example, the communicating signal processing circuit 87 may be a modem of a personal computer (PC), a local area network (LAN) card, or various interface circuits.

Figure 11:
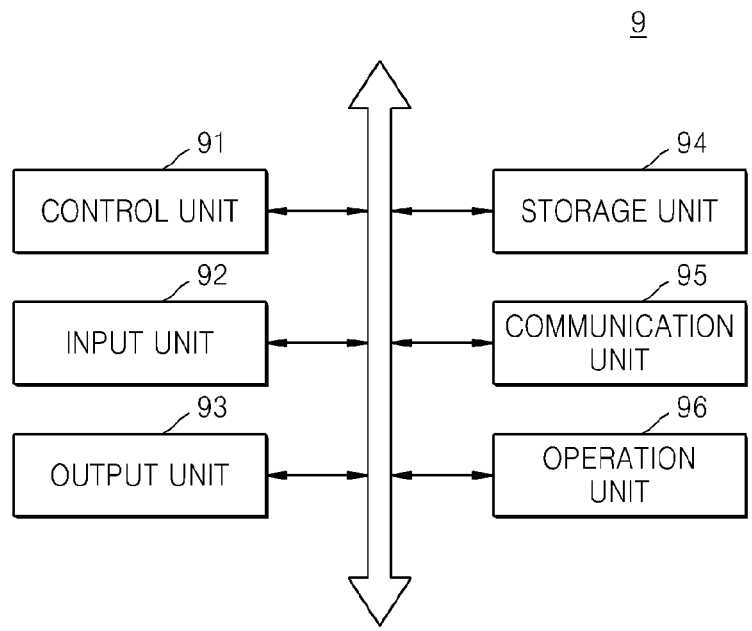
FIG. 11 illustrates a block diagram schematically illustrating an electronic system including the electronic circuit board illustrated in FIG. 10 according to an exemplary embodiment of the present general inventive concept.

FIG. 11 is a block diagram schematically illustrating an electronic system 9.

Referring to FIG. 11, the electronic system 9 may include a control unit 91, an input unit 92, an output unit 93, and a storage unit 94 and may further include a communication unit 95 and an operation unit 96.

The control unit 91 may control the electronic system 9 and elements of the electronic systems 9. The control unit 91 may be understood as a CPU or central control unit and may include the electronic circuit board 8 of FIG. 10. The input unit 92 may transmit electrical instruction signals to the control unit 91.

The input unit 92 may be a keyboard, a keypad, a mouse, an image recognition device, such as a scanner, or various input sensors.

The output unit 93 may receive the electrical instruction signals from the control unit 91 and may output the result of processing the electrical instruction signals by using the electronic system 9. The output unit 93 may be a monitor, a printer, a beam irradiator, or various mechanical devices.

The storage unit 94 may be an element for temporarily or permanently storing electrical signals to be processed or processed by the control unit 91. The storage unit 94 may be physically or electrically connected or coupled to the control unit 91. The storage unit 94 may be semiconductor memory, a magnetic storage device, such as a hard disc, an optical storage device, such as a compact disc, or another server having a data storage function. The storage unit 94 may include the wafer level package fabricated using the method of fabricating the wafer level package illustrated in FIGS. 1 through 3 and FIGS. 5 through 7 or FIG. 9.

The communication unit 95 may transmit/receive electrical signals to/from another electronic system in response to the electrical instruction signals received from the control unit 91. The communication unit 95 may be a wired transmitting/receiving device, such as a modem or a LAN card, a wireless transmitting/receiving device, such as a Wibro interface, or an infrared port.

The operation unit 96 may perform a physical or mechanical operation according to instructions of the control unit 91. For example, the operation unit 96 may be an element that performs a mechanical operation, such as a plotter, an indicator, or an up/down operator. The electronic system 9 according to the inventive concept may be, for example, a computer, a network server, a networking printer or scanner, a wireless controller, a terminal for mobile communication, an exchanger, or another electronic product that performs a programmed operation.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include a semiconductor memory device, a read-only memory (ROM), a random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a wafer level pacakge, the method comprising:
   preparing a wafer including a plurality of first semiconductor chips;
   mounting a plurality of second semiconductor chips on the wafer;
   disposing the wafer on a lower mold and disposing an upper mold so as to surround edges of a top surface of the wafer;
   dispensing a molding member on the wafer; and
   pressurizing the molding member by using a plunger so as to fabricate a wafer level package in which a top surface of each of the plurality of second semiconductor chips is exposed.

2. The method of claim 1, wherein the mounting of the plurality of second semiconductor chips comprises mounting the plurality of second semiconductor chips on the wafer by using flip chip bonding.

3. The method of claim 1, further comprising:
   between the mounting of the plurality of second semiconductor chips and the disposing of the upper mold, forming an underfill member between each of the second semiconductor chips and the wafer.

4. The method of claim 1, wherein:
   the second semiconductor chips each have a structure in which a plurality of semiconductor chips are stacked, the plurality of semiconductor chips being connected to each other via a through silicon via (TSV); and
   the second semiconductor chips are electrically connected to the first semiconductor chips.

5. The method of claim 1, further comprising:
   between the dispensing of the molding member on the wafer and the fabricating of the wafer level package, attaching a release film to a bottom surface of the plunger.

6. The method of claim 5, wherein a thickness of the release film is about 50 μm to about 200 μm.

7. The method of claim 1, wherein the disposing of the upper mold further comprises disposing a molding member on a top surface of the wafer between the second semiconductor chips.

8. The method of claim 7, wherein a top surface of the molding member has a step height of about ±25 μm based on a top surface of each second semiconductor chip.

9. The method of claim 1, wherein the dispensing of the molding member on the wafer comprises:
calculating a first volume by multiplying a width of the wafer excluding a region that contacts the upper mold and a height of the top surface of each second semiconductor chip from the top surface of the wafer;
calculating a second volume by multiplying the height and a sum of the widths of the plurality of second semiconductor chips; and
calculating a volume of the molding member to be dispensed on the wafer by subtracting the second volume from the first volume and predicting a weight of the molding member by multiplying the volume of the molding member and a density of the molding.

10. The method of claim 1, wherein:
a width of the first semiconductor chip is equal to or greater than a width of the second semiconductor chip; and
a size of the first semiconductor chip is equal to or greater than a size of the second semiconductor chip based on the same direction.

11. The method of claim 1, wherein the dispensing of the molding member on the wafer comprises dispensing the molding member in a plurality of points of the wafer.

12. A method of fabricating a wafer level package, the method comprising:
mounting a plurality of second semiconductor chips on a wafer;
disposing the wafer on a lower mold and disposing an upper mold so as to surround edges of a top surface of the wafer such that a molding process is performed;
dispensing a molding member on the wafer; and
performing a compression process using a plunger on the dispensed molding member so as to fabricate a wafer level package in which a top surface of each of the plurality of second semiconductor chips is exposed.

13. The method of claim 12, wherein the wafer comprises a plurality of first semiconductor chips, and the second semiconductor chips are electrically connected to the plurality of first semiconductor chips by using a plurality of bumps.

14. The method of claim 12, wherein the fabricating of the wafer level package comprises disposing the molding member on the top surface of the wafer between the second semiconductor chips, and wherein a top surface of the molding member has a step height of about ±25 μm based on the top surface of each second semiconductor chip.

15. The method of claim 12, wherein the second semiconductor chips each have a structure in which a plurality of semiconductor chips are stacked, the plurality of semiconductor chips being connected to each other via a through silicon via (TSV), and in the fabricating of the wafer level package, a top surface of each second semiconductor chip is exposed.

16. A method of fabricating a wafer level package such that a top surface of a plurality of semiconductor chips of the wafer level package is exposed without performing a grinding process, the method comprising:
calculating a predetermined amount of a molding member according to the volume of space between the plurality of semiconductor chips;
disposing the predetermined amount of molding member within in a mold on a top surface of the wafer level package; and
shaping the molding member such that the top surface of the plurality of semiconductor chips is exposed.

17. The method of claim 16, further comprising:
dicing the wafer level package such that each unit wafer level package may be fabricated.

* * * * *